(12) United States Patent
Kumagai et al.

(10) Patent No.: US 6,365,948 B1
(45) Date of Patent: Apr. 2, 2002

(54) MAGNETIC TUNNELING JUNCTION DEVICE

(75) Inventors: Seiji Kumagai, Miyagi; Toshihiko Yaoi, Kanagawa; Yoshito Ikeda, Miyagi, all of (JP)

(73) Assignee: Sony Corporation, Tokyo (JP)

( * ) Notice: Subject to any disclaimer, the term of this patent is extended or adjusted under 35 U.S.C. 154(b) by 487 days.

(21) Appl. No.: 08/824,716

(22) Filed: Mar. 26, 1997

(30) Foreign Application Priority Data

Mar. 29, 1996 (JP) .............................................. 8-077980

(51) Int. Cl.$^7$ .............................................. H01L 29/82
(52) U.S. Cl. ..................................................... 257/421
(58) Field of Search ......................................... 257/421

(56) References Cited

U.S. PATENT DOCUMENTS 5,650,958 A * 7/1997 Gallagher et al. .......... 365/173

* cited by examiner

*Primary Examiner*—Olik Chaudhuri
*Assistant Examiner*—Douglas A. Wille
(74) *Attorney, Agent, or Firm*—Sonnenschein, Nath & Rosenthal

(57) ABSTRACT

A magnetic tunneling effect device capable of displaying a so-called magnetic tunneling effect in stability, more specifically, a magnetic tunneling junction device in which a first magnetic metal layer and a second magnetic metal layer are connected together by ferromagnetic tunnel junction via an insulating layer and in which the conductance of the tunnel current is changed by the relative angle of magnetization of these magnetic metal layers. The ferromagnetic tunnel junction has a junction area of not larger than $1 \times 10^{-9}$ m$^2$. For reliably controlling the junction area of the ferromagnetic tunnel junction, the insulating layer is formed by a first insulating layer for ferromagnetic tunnel junction and a second insulating layer formed on the first insulating layer for controlling the junction area of the ferromagnetic tunnel junction.

6 Claims, 5 Drawing Sheets

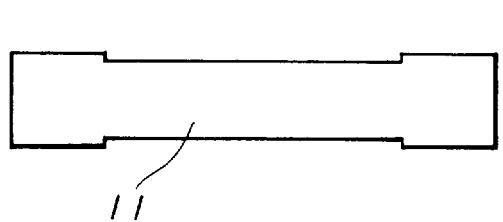 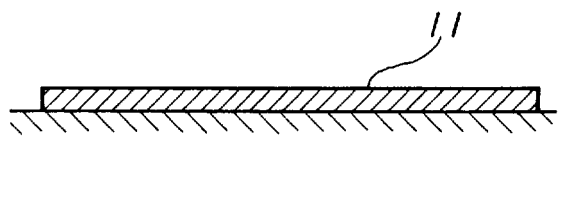
FIG.6A   FIG.6B
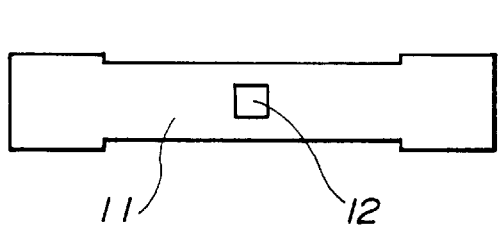 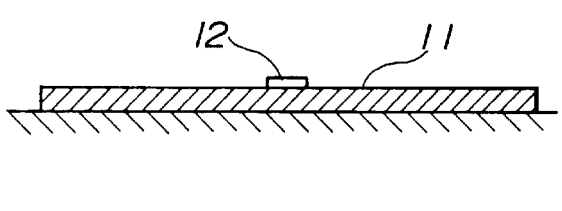
FIG.7A   FIG.7B

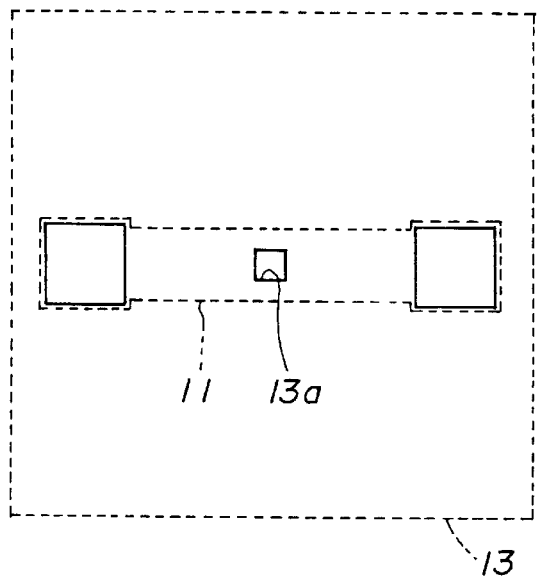
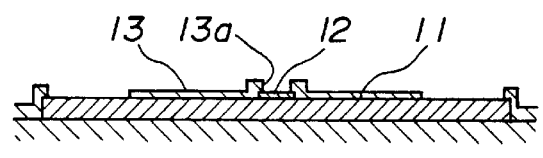
FIG.8A  FIG.8B
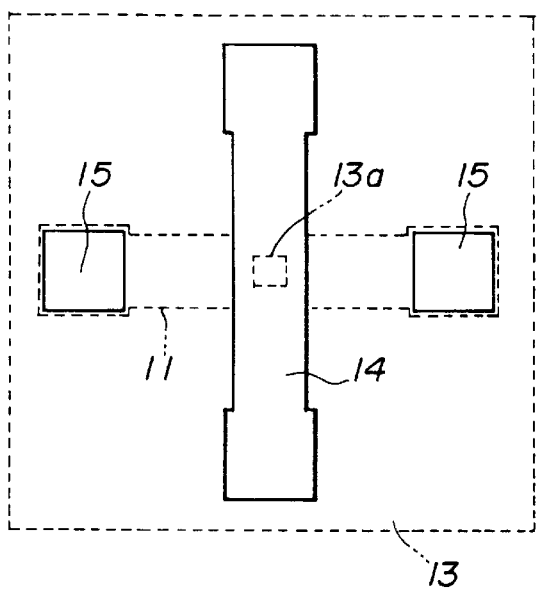
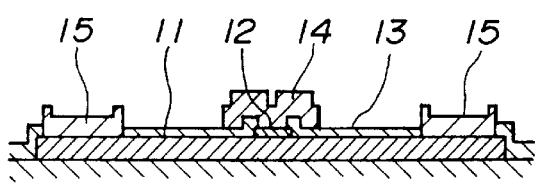
FIG.9A  FIG.9B

MAGNETIC TUNNELING JUNCTION DEVICE

BACKGROUND OF THE INVENTION

1. Field of the Invention

This invention relates to a magnetic tunneling junction device displaying a so-called magnetic tunneling effect having a three-layer structure of a magnetic metal layer/insulating layer/magnetic metal layer, in which the conductance of the tunneling current flowing if the insulating layer has a thickness of tens of Angstroms is changed in dependence upon the relative angle of the directions of magnetization of both magnetic metal layers.

2. Description of the Related Art

Reports have been made of the magnetic tunneling effect in which, in a three-layer structure of the magnetic metal layer/insulating layer/magnetic metal layer, the conductance of the tunneling current flowing in case the insulating layer has a thickness of tens of Angstroms depends on the relative angle of magnetization of both magnetic metal layers.

In this phenomenon, the magnetoresistance ratio can be theoretically calculated based on the polarizability of magnetization of both magnetic metal layers. For example, if Fe is used for both magnetic metal layers, an extremely large magnetoresistance ratio is predicted to be produced.

This prediction has not been realized for long. Recently, by the combination of $Fe/Al_2O_3/Fe$, an extremely large magnetoresistance ratio of approximately 18% at room temperature has been realized. Thus, not only the physical manifesting mechanism but also the application as a new electro-magnetic transducer element, for example, is attracting general attention.

With regard to the magnetic tunneling junction device, exploiting the magnetic tunneling effect, only basic research has been started in connection with formation of an insulating layer by sputtering oxidation or preparation of fine junction by photolithography.

The most crucial problem raised in this research is the frequent failure in producing changes in resistance due to defects in the junction portion. If pinholes or similar defects are present in the insulating layer for the magnetic tunneling effect, or if some portions of the junction element are structurally susceptible to destruction of insulation, electrical leakage occurs leading instantly to failure in production of changes in resistance.

SUMMARY OF THE INVENTION

It is therefore an object of the present invention to provide a magnetic tunneling junction device capable of stably manifesting the magnetic tunneling effect.

The present invention provides a magnetic tunneling junction device in which a first magnetic metal layer and a second magnetic metal layer are connected together by ferromagnetic tunnel junction via an insulating layer and in which the conductance of the tunnel current is changed by the relative angle of magnetization of these magnetic metal layers, wherein the ferromagnetic tunnel junction has a junction area of not larger than $1 \ 10^{-9} \ m^2$.

By reducing the junction area to an extremely small value, a probability of the pinhole existing in the junction portion is reduced to exhibit the magnetic tunneling effect stably.

According to the present invention, the junction area of the ferromagnetic tunnel junction needs to be controlled positively. To this end, the insulating layer, for example, is preferably formed by the first insulating layer for ferromagnetic tunnel junction and a second insulating layer formed on the first insulating layer for limiting the junction area for the ferromagnetic tunnel junction.

This reliably limits the junction area of the ferromagnetic tunnel junction and provides a structure having excellent insulating properties for displaying the magnetic tunneling effect in higher stability.

According to the present invention, the magnetic tunneling effect can be displayed stably by prescribing the junction area of the ferromagnetic tunnel junction to a pre-set value.

BRIEF DESCRIPTION OF THE DRAWINGS

FIGS. 6A and 6B to FIGS. 9A and 9B show an example of the method for producing a magnetic tunneling junction device, step-by-step, wherein FIGS. 6A and 6B are a plan view and a cross-sectional view showing the process for forming a first magnetic metal layer, respectively.

FIGS. 7A and 7B are a plan view and a cross-sectional view showing the process for forming a first insulating layer operating as a tunnel barrier.

FIGS. 8A and 8B are a plan view and a cross-sectional view showing the process for forming a second magnetic metal layer, respectively.

FIGS. 9A and 9B are a plan view and a cross-sectional view showing the process for forming a second magnetic metal layer, respectively.

DESCRIPTION OF THE PREFERRED EMBODIMENTS

Figure 1:
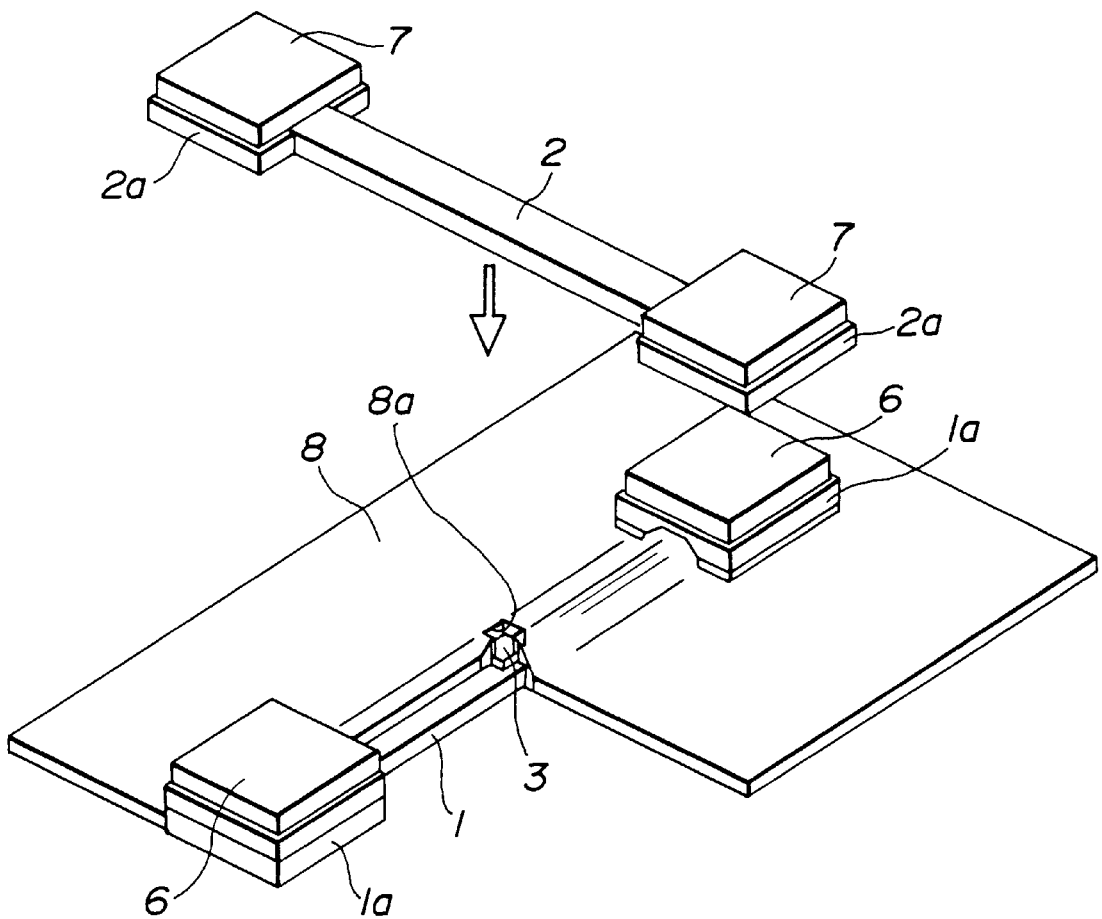
FIG. 1 is an exploded perspective view showing an illustrative structure of a magnetic tunneling junction device according to the present invention.

Referring to the drawings, preferred embodiments of the present invention will be explained in detail.

Basically, a magnetic tunneling effect device is comprised of a pair of magnetic metal layers 1, 2 arranged at right angle with each other and connected together via an extremely thin insulating layer 3.

The first magnetic metal layer 1 is formed of an NiFe alloy and is 1000 Å in thickness.

The second magnetic metal layer 2 is formed of Co and in similarly 1000 Å in thickness.

The insulating layer 3 is formed of $Al_2O_3$ and is of a thickness necessary to permit the tunneling current to flow therein. Specifically, it is tens of Angstroms, herein 50 Å.

Figure 3:
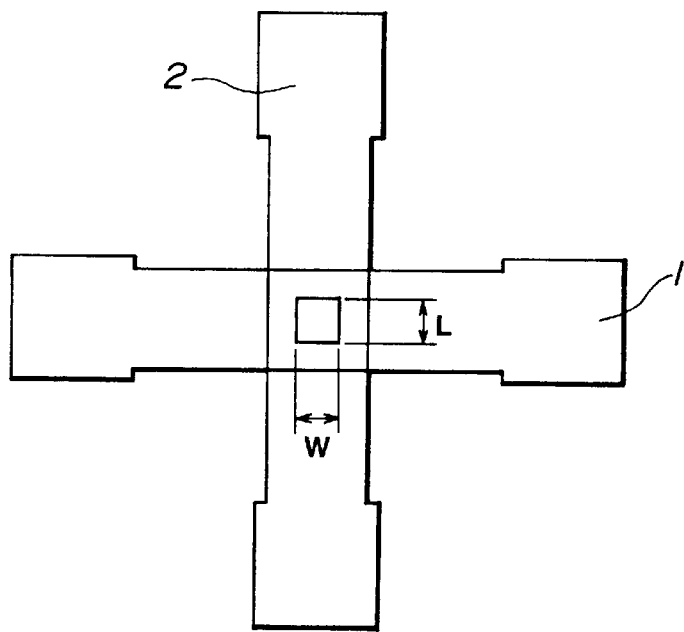
FIG. 3 is a schematic plan view showing an illustrative structure of a magnetic tunneling junction device according to the present invention.

FIG. 3 schematically shows the planar structure of the magnetic tunneling device. An area S of the junction area is found from the product of the longitudinal size and the transverse size of an opening 8a formed in the second insulating layer 8 (L M).

For checking the effect of the junction area on characteristics, several sorts of patterns were formulated with junction areas of from 85 85 $\mu m^2$ to 3 3 $\mu m^2$ and changes in the rate of resistance change to the junction area were checked.

For measurement, Cu was formed on the uppermost surfaces of electrode portions 1a, 2a of the magnetic metal layers 1, 2, for maintaining optimum contact thereof with terminals, as explained previously. The changes in resistance were measured by a dc four-terminal method.

Figure 4:
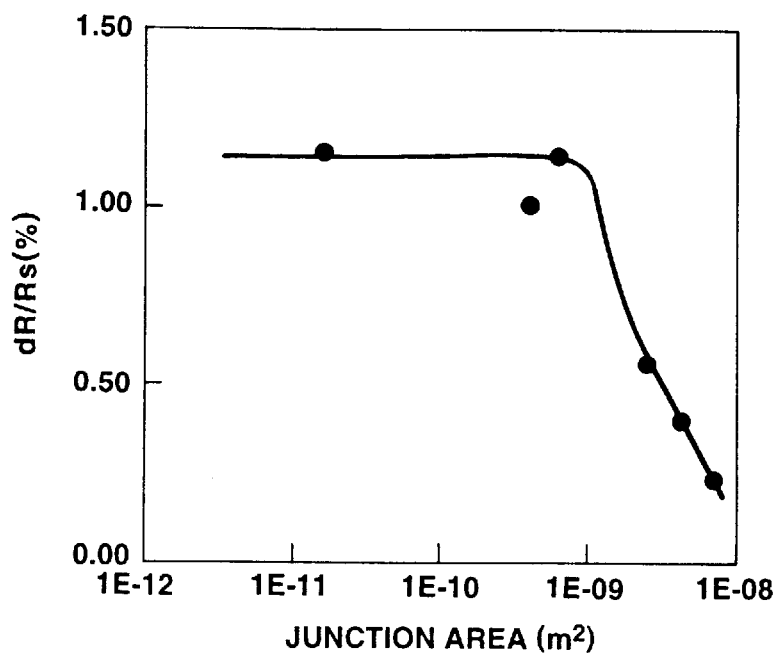
FIG. 4 is a graph showing junction area dependency of the resistance change rate.

FIG. 4 shows values of changes in resistance with respect to the junction area. If the junction area ranges between approximately $10^{-8}$ $m^2$ to $10^{-9}$ $m^2$, the rate of changes in resistance tends to become larger the smaller the junction area. If the junction area is smaller than this range, there is noticed no such junction area dependent change in the resistance change rate.

From this it may be shown that, if the junction area is not more than $10^{-9}$ $m^2$, it becomes possible for the magnetic tunneling effect to be manifested in stability.

Figure 5:
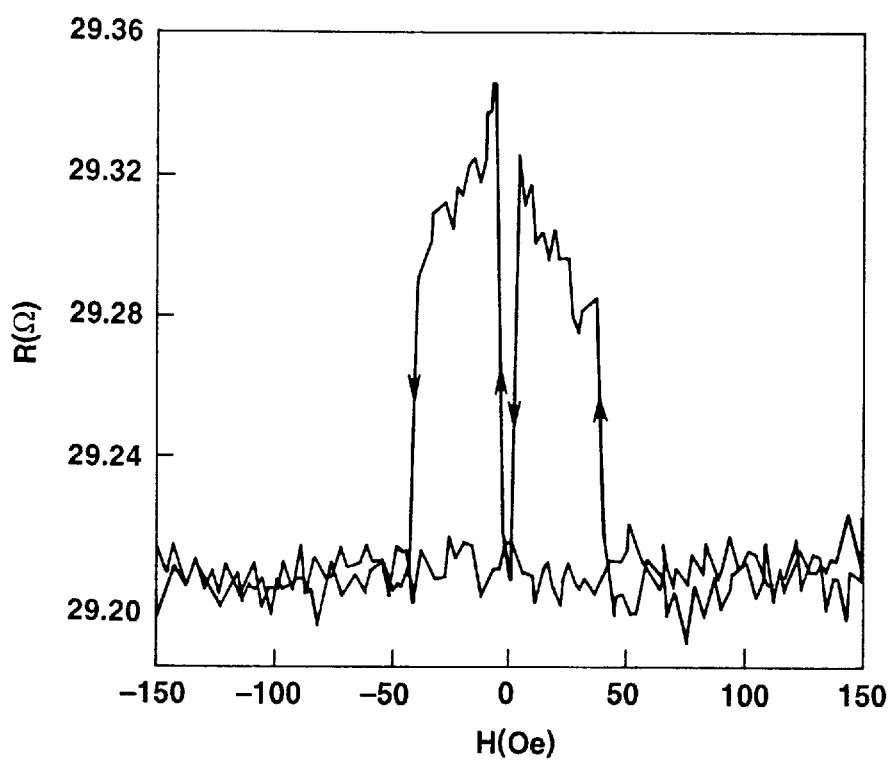
FIG. 5 is a graph showing an example of a magnetic field versus resistance change curve.

FIG. 5 shows a typical magnetic field-resistance change curve obtained at this time. The resistance value is changed responsive to the relative angle of magnetization of the two magnetic metal layers 1, 2 to manifest the magnetic tunneling effect.

The method for producing the above-described magnetic tunneling junction device is explained.

In the present embodiment, for taking into account the possible use of the device for a sensor or the like, the combination of NiFe and Co is used as a material for the magnetic metal layer, while an oxidized Al film was used for an insulating layer for the ferromagnetic tunneling junction. The NiFe—Co combination is selected because changes in resistance can be expected to occur with this combination for a small change in the magnetic field. The material for the magnetic metal layer is not limited to such material and any other material may be used if it gives rise to the magnetic tunneling effect.

The respective layers were formed by the sputtering method. For a substrate, a glass substrate was used. For improving planarity of the substrate surface, $Al_2O_3$ was formed to a thickness of 2000 Å to form an underlying layer which was ground by buff grinding to a thickness of 1000 Å.

First, an NiFe film was formed to a thickness of 1000 Å by the sputtering method on the substrate coated with the underlying layer. This NiFe film was milled to a pre-set shape by Ar ion milling to form a first magnetic metal layer 11, as shown in FIGS. 6A and 6B.

Then, an Al film was formed thereon, patterned to a desired shape by the lift-off method and oxidized to form a first insulating layer 12, as shown in FIGS. 7A and 7B. The Al film was oxidized by allowing the formed Al film to stand in atmosphere for 48 hours. The first insulating layer 12 is an insulating layer for forming the ferromagnetic tunneling junction.

After forming the first insulating layer 12 in this manner, a junction domain was set as shown in FIGS. 8A and 8B. A second insulating layer 13 was formed by $SiO_2$ for preventing shorting at the junction end portion. An opening 13a for prescribing the above-mentioned junction area, was formed in the second insulation layer 13 by the lift-off method. Of course, the opening 13a maybe formed by etching or other photographic methods.

By initially forming the first insulating layer 12, as the tunneling barrier, on the planar magnetic metal layer 11, a uniform film thickness may be realized in the junction domain, while defects in the vicinity of the step difference of the second insulating layer 13 may be eliminated. If an opening is formed in the second insulating layer and an insulating layer is formed therein to form the first insulating layer operating as a tunnel barrier, the first insulating layer tends to be reduced in thickness at the inner rim of the opening, so that leakage is likely to occur by the defect.

An upper magnetic layer of Co was then formed thereon, as shown in FIGS. 9A and 9B, and milled as in the case of the first magnetic metal layer 11, for forming a pattern for forming a second magnetic layer 14. Finally, Co was deposited as shown at 15 on the surface of the electrode portion of each of the magnetic metal layers 11, 14 in order to maintain optimum contact of the tunneling junction device with the terminal such as during measurement.

Figure 2:
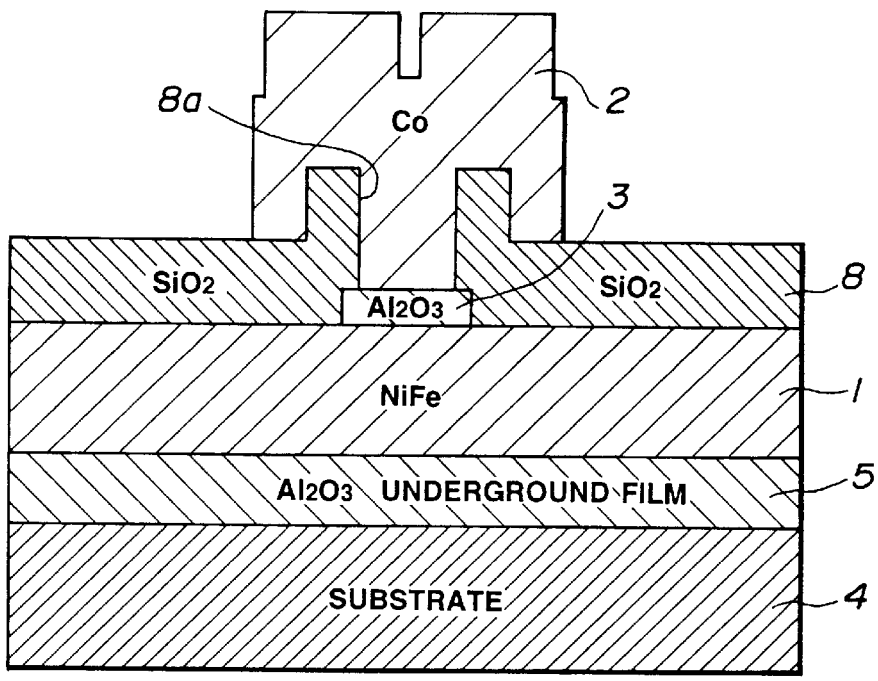
FIG. 2 is a schematic cross-sectional view showing essential portions of an illustrative structure of a magnetic tunneling junction device according to the present invention.

This completes the magnetic tunneling junction device configures as shown in FIGS. 1 and 2.

What is claimed is:

1. A magnetic tunneling junction device comprising:
   a first magnetic metal layer;
   a second magnetic metal layer:
   wherein said second magnetic metal layer is formed above the first magnetic metal layer; and
   first and second insulating layers formed between the first and second magnetic metal layers wherein the second insulating layer surrounds the first insulating layer and a surface area of the first insulating layer in contact with the second magnetic metal layer is less than $1\times10^{-9} m^2$.

2. The tunneling junction device as claimed in claim 1 wherein said first magnetic metal layer is formed of an NiFe alloy and said second magnetic metal layer is formed of Co.

3. The tunneling junction device as claimed in claim 1 wherein said first insulating layer is formed of $Al_2O_3$ and said second insulating layer is formed of $SiO_2$.

4. A method of forming a magnetic tunneling junction device comprising the steps of:
   forming a first magnetic metal layer;
   forming a second magnetic metal layer:
   wherein the step of forming said second magnetic metal layer comprises forming the second magnetic metal layer above the first magnetic metal layer; and
   first and second insulating layers formed between the first and second magnetic metal layers wherein the second insulating layer at least substantially surrounds the first insulating layer and a surface area of the first insulating layer in contact with the second magnetic metal layer is less than $1\times10^{-9} m^2$.

5. The method of claim 4, wherein the first magnetic metal layer is comprised of an NiFe alloy and the second magnetic metal layer is comprised of Co.

6. The method of claim 4, wherein the first insulating layer is comprised of $Al_2O_3$ and the second insulating layer is comprised of $SiO_2$.

* * * * *